(12) United States Patent
Park et al.

(10) Patent No.: US 6,857,470 B2
(45) Date of Patent: Feb. 22, 2005

(54) STACKED CHIP PACKAGE WITH HEAT TRANSFER WIRES

(75) Inventors: Hee-Jin Park, Chungcheongnam-do (KR); Tae-Gyeong Chung, Kyungki-do (KR); Eun-Chul Ahn, Chungcheongnam-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/719,670

(22) Filed: Nov. 20, 2003

(65) Prior Publication Data

US 2004/0196635 A1 Oct. 7, 2004

(30) Foreign Application Priority Data

Nov. 20, 2002 (KR) ................................ 10-2002-0072256

(51) Int. Cl.[7] .............................. H01L 21/50; F28F 7/00
(52) U.S. Cl. ..................... 165/185; 257/777; 438/122
(58) Field of Search ............................. 165/185, 80.2, 165/96; 257/777, 784, 796, 783, 724; 361/760, 704, 707, 686, 687; 438/122, 113, 119; 29/850

(56) References Cited

U.S. PATENT DOCUMENTS

| | | | | |
|---|---|---|---|---|
| 4,763,188 A | * | 8/1988 | Johnson | 257/777 |
| 5,438,224 A | * | 8/1995 | Papageorge et al. | 257/777 |
| 5,610,442 A | * | 3/1997 | Schneider et al. | 257/787 |
| 5,804,004 A | * | 9/1998 | Tuckerman et al. | 156/60 |
| 6,236,109 B1 | * | 5/2001 | Hsuan et al. | 257/688 |
| 6,291,881 B1 | * | 9/2001 | Yang | 257/723 |
| 6,294,838 B1 | | 9/2001 | Peng | |
| 6,716,676 B2 | * | 4/2004 | Chen et al. | 438/122 |
| 6,720,662 B1 | * | 4/2004 | Den | 257/777 |
| 6,737,750 B1 | * | 5/2004 | Hoffman et al. | 257/777 |
| 6,784,023 B2 | * | 8/2004 | Ball | 438/113 |

FOREIGN PATENT DOCUMENTS

| | | |
|---|---|---|
| KR | 2002-36191 | 5/2002 |
| KR | 2002-43395 | 6/2002 |

OTHER PUBLICATIONS

English language of Korean Abstract for Korean Patent Publication No. 2002–43395 published Jun. 10, 2002.
English language of Korean Abstract for Korean Patent Publication No.2002–36191, published May 16, 2002.

* cited by examiner

*Primary Examiner*—Tho V Duong
(74) *Attorney, Agent, or Firm*—Marger, Johnson & McCollom PC

(57) ABSTRACT

The present invention provides a stacked chip package having at least one heat transfer wire. The heat transfer wire is disposed between the stacked chips and at least one end of each transfer wire is connected to a dummy pad provided on the board. Therefore, the heat generated by the chips and trapped between the chips can be effectively dissipated. The heat transfer wires can be formed on the uppermost chip of the stacked chips to enhance the heat dissipation. In addition, by controlling the number or the size of the heat transfer wire, the thermal characteristics of the stacked chip package can be modified.

20 Claims, 4 Drawing Sheets

STACKED CHIP PACKAGE WITH HEAT TRANSFER WIRES

This application claims priority from Korean Patent Application No. 2002-72256, filed on Nov. 20, 2002, the contents of which are incorporated herein by reference in their entirety.

BACKGROUND OF THE INVENTION

1. Field of the Invention

The present invention relates to a semiconductor package and, more particularly, to a stacked chip package that includes heat transfer wires.

2. Description of the Related Art

The electronic industry continues to seek products that are lighter, faster, smaller, multi-functional, more reliable and more cost-effective. In order to meet the requirement of the electronic industries, circuit chips must become highly integrated.

However, enhancing the density of chips for purposes of making them highly integrated is expensive and has technical limitations. Therefore, three-dimensional semiconductor packaging technologies have been developed and are being used. In general, package stacks made by stacking a plurality of packages, and stacked chip packages made by stacking a plurality of chips, are broadly known.

It is possible to achieve high density of integration by using package stacks. However, the thickness of the individual packages may increase the thickness of the package stacks. Compared with package stacks, it is possible not only to achieve a high density of integration but also to minimize the thickness by using stacked chip packages.

Referring to FIG. 1, the conventional structure of the stacked chip package (100) will be explained. As shown in FIG. 1, two chips (21, 22) are stacked on a substrate (10). The two stacked chips (21, 22) are connected to the substrate (10) electrically by bonding wires (32, 34). Between the lower chip (21) and the upper chip (22), an adhesive layer (40) is formed which adheres the two chips (21, 22) to each other. The chips (21, 22) and the bonding wires (32, 34) are encapsulated by resin (50) such as Epoxy Molding Compound (EMC). On the rear side of the substrate (10), outer terminals (60), such as solder balls or the like, are formed and connected to the chips (21, 22) by bonding wires (32, 34) and through via holes (not shown in the figure) in the substrate (10).

However, there is a thermal dissipation problem in the conventional stacked chip package shown in FIG. 1. The technical problem in connection with heat dissipation is described in FIG. 2. As shown in FIG. 2, the heat generated by the two chips (21, 22) is transferred to the adhesive layer (40) and trapped therein.

If the heat trapped in the adhesive layer (40) cannot be dissipated, it can result in heating of the chips (21, 22), especially heating of the lower chip (21). Therefore, the performance of the stacked chip package (100) will deteriorate, if the technical problem of the heat trapped in the adhesive layer (40) cannot be solved.

SUMMARY OF THE INVENTION

In one embodiment, a stacked chip package comprises a board including a plurality of board pads and a plurality of dummy board pads. A plurality of chips each have at least one bonding pad. The plurality of chips are stacked one atop the other on the board. At least one heat transfer wire is disposed between the chips. At least one end of each heat transfer wire is connected to at least one dummy board pad, and each bonding pad is electrically connected to at least one of the board pads. Accordingly, the heat trapped between the chips can be transferred through the heat-transfer wires and the dummy board pads.

Preferably, both ends of each heat transfer wire may be connected to the dummy board pads.

Preferably, more than one dummy bonding pad may be provided on each chip, and one end of each heat transfer wire may be connected to one of the dummy bonding pads.

Preferably, a plurality of solder balls may be provided on the rear side of the board, and electrically connected to the board pads and the dummy board pads.

Preferably, at least one of the heat transfer wires may be used for connecting means to ground.

Preferably, the chips may be attached to each other by an adhesive layer.

Preferably, more than one heat transfer wire may be disposed on the uppermost chip of the stacked chips in order to enhance the heat dissipation.

Preferably, each heat transfer wire is a conventional bonding wire.

According to another embodiment of the present invention, a method for producing a stacked chip package comprises providing a board including at least one board pad and least one dummy board pad; providing a plurality of chips each having at least one bonding pad; stacking said plurality of chips being one atop the other on the board; and disposing at least one heat transfer wire between the chips. At least one end of each heat transfer wire being connected to at least one dummy board pad for heat dissipation purposes, and each bonding pad being electrically connected to at least one of the board pads.

DETAILED DESCRIPTION OF THE PREFERRED EMBODIMENT

Figure 1:
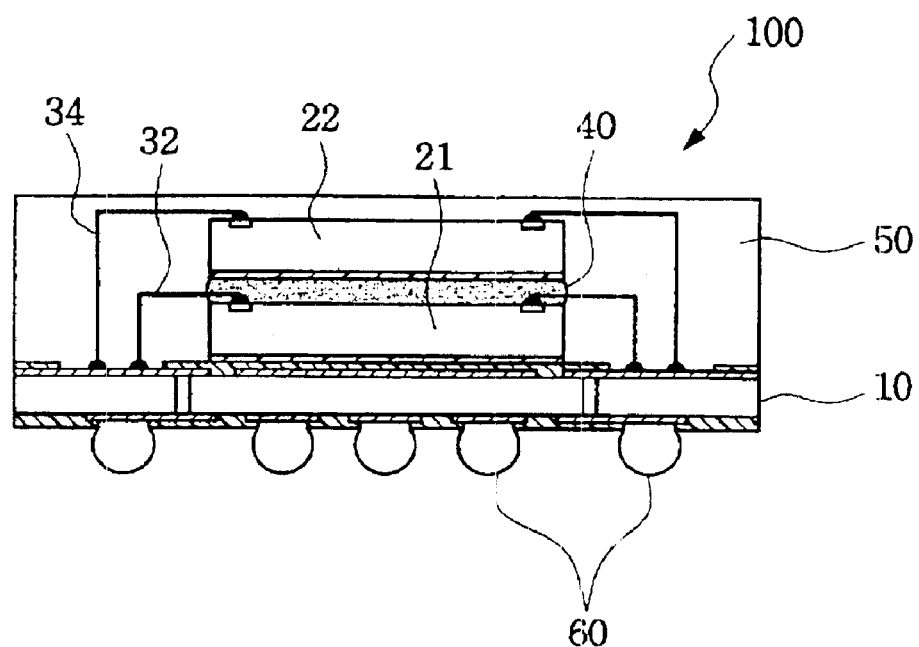
FIG. 1 is a cross-sectional view of the conventional stacked chip package.
Figure 2:
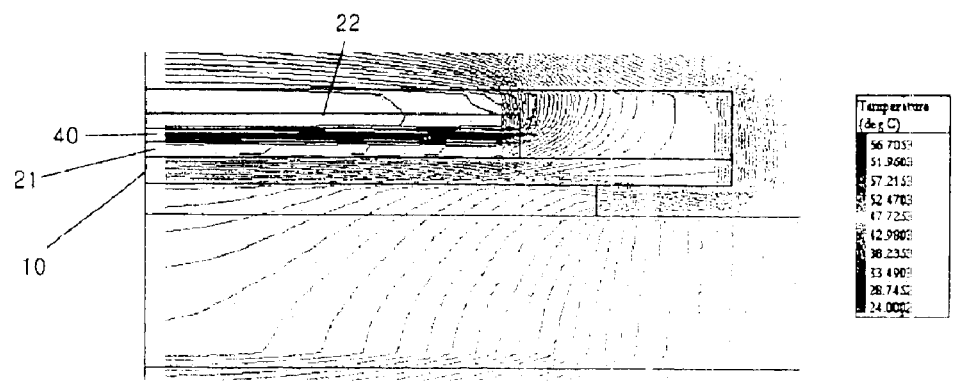
FIG. 2 shows the thermal characteristics of the stacked chip package of FIG. 1 by a simulation.
Figure 3:
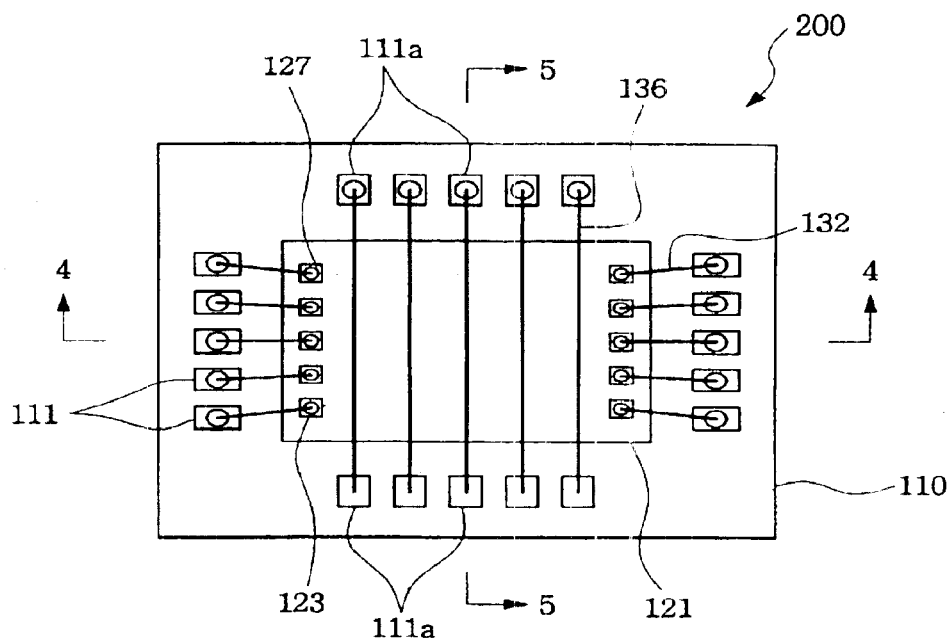
FIG. 3 is a plan view of the stacked chip package according to a first embodiment of the present invention.
Figure 4:
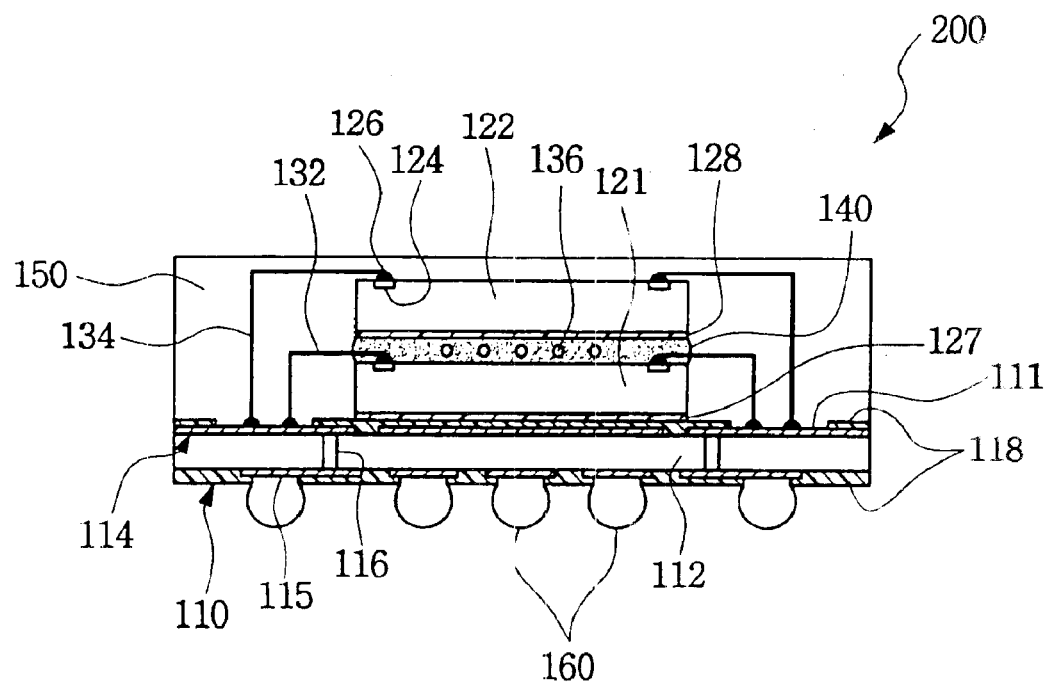
FIG. 4 is a cross-sectional view of the stacked chip package taken along 4—4 of FIG. 3.
Figure 5:
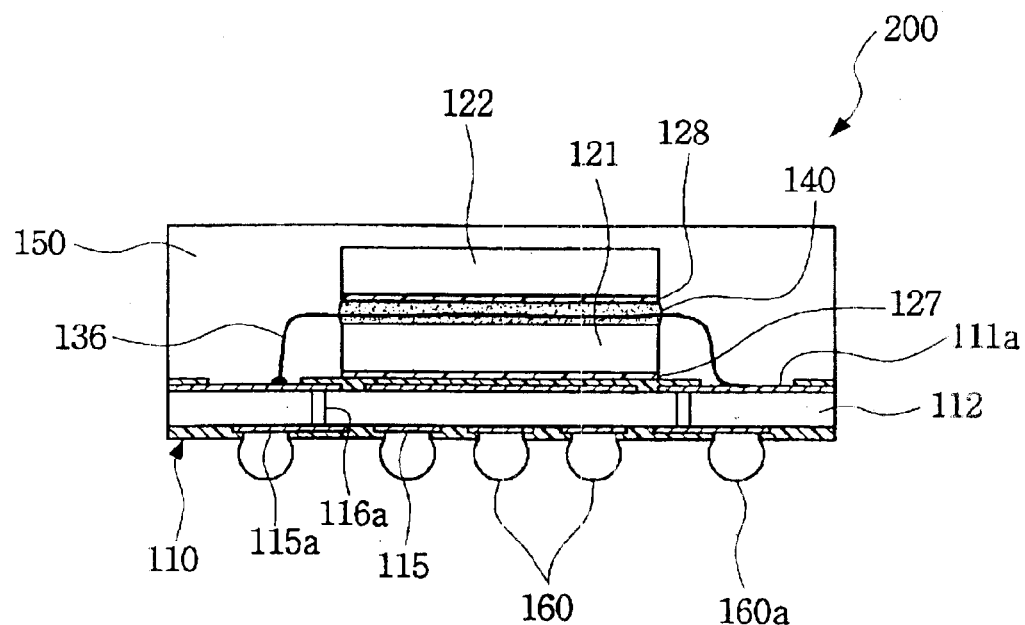
FIG. 5 is a cross-sectional view of the stacked chip package taken along 5—5 of FIG. 3.

The stacked chip package according to a first embodiment of the present invention is illustrated in FIG. 3., FIG. 4, and FIG. 5. FIG. 3 is a plan view of the stacked chip package made by stacking two chips denoted 121 and 122. In FIG. 3, the upper chip (122) is not fully depicted, in order to show a plurality of heat-transfer wires (136) disposed on the lower chip (121).

According to the first embodiment of the present invention, two chips (121, 122) are stacked on a board (110) three-dimensionally, and are attached to each other by the adhesive layer (140). The chips (121, 122) are electrically connected to the board (110) by the bonding wires (132, 134) and encapsulated by a resin (150), such as EMC. In order to dissipate the heat generated by the two chips (121, 122) which is trapped in the adhesive layer (140), the heat-transfer wires (136) are disposed between the lower chip (121) and the upper chip (122). Each end of the heat-transfer wires (136) is attached to the board (110).

Preferably, the board (110) is a printed circuit board (PCB). The board (110) is composed of a board body (112), and a plurality of metal wiring patterns (114) formed on the board body (112). The metal wiring patterns (114) comprise upper wiring patterns including board pads (111), and lower wiring patterns having solder ball pads (115). The board pads (111) are connected to the chips (121, 122) by the bonding wires (132, 134) and solder balls (160) are formed on the solder ball pads (115). More specifically, each of the bonding pads on the chips (121,122) is electrically connected to one of the board pads (111).

Preferably, the metal wiring patterns (114) may be manufactured by patterning laminated copper foils on the board body (112). A solder resist layer (118) is formed on substantially the entire area of the board (110) except for the solder ball pads (115) and the board pads (111). Preferably, the solder ball pads (115) are electrically connected to the board pads (111) by via holes (116) formed thorough the board body (112).

In addition to the board pads (111), which are electrically connected to the chips (121, 122), dummy board pads (111a), which are not electrically connected to the chips (121, 122), are provided on the board body (112). The heat-transfer wires (136) are attached to the dummy board pads (111a). Preferably, the dummy board pads (111a) are connected to the dummy solder ball pads (115a) by dummy via holes (116a). Solder balls for transmitting the heat may be formed on the dummy solder ball pads (115a). The dummy board pads (111a), the dummy via holes (116a), and the dummy solder ball pads (115a) are used for heat transfer, and not for electrical connection between the chips (121, 122) and outer terminals. However, the dummy board pads (111a), the dummy via holes (116a) and the dummy solder ball pads (115a) may be used as the connecting means to ground.

Although a printed circuit board (PCB) is disclosed as the board (110) in the first embodiment of the present invention, for example, a lead frame, a tape circuit board or a ceramic board can also be used as the board (110).

According to a first embodiment of the present invention, a plurality of bonding pads (123) are formed along opposite edges of the lower chip (121). The lower chip (121) is attached to the board (110) by a non-conductive adhesive layer (127) or by applying adhesive to the lower chip (121) or to the board (110). The bonding pads (123) are electrically connected to the board pads (111) by the lower bonding wires (132). In order to reduce the height of the bonding wire loop, each lower bonding wire (132) is connected to the board pad (111) by ball bonding, and connected to the bonding pad (123) by stitch bonding.

Preferably, the heat transfer wires (136) are formed by using wire bonding methods. One end of each heat transfer wire (136) is connected to a dummy board pad (111a) by ball bonding, and the other end of the heat transfer wire (136) is connected to another dummy board pad (111a) by stitch bonding. Although it is desirable for the heat transfer wires (136) to be separated from the lower chip (121), there is no electric-short problem even if the heat transfer wires (136) are in contact with the lower chip (121). Preferably, a metal such as Au or Al having excellent heat conductivity is used to form the heat transfer wires (136).

The upper chip (122) and the lower chip (121) are attached to each other by the adhesive layer (140). A non-conductive layer (128) may be formed beneath the upper chip (122), in order to prevent an electrical short between the upper chip (122) and the lower bonding wires (132). The bonding pads (124) of the upper chip (122) are connected to the board pads (111) by upper bonding wires (134). Each end of the upper bonding wires (134) is connected to the bonding pad (124) and the board pad (111), respectively, by a wire bonding method which is used for forming the lower bonding wires (132).

In order to protect the chips (121, 122) and the bonding wires (132,134), the chips (121, 122), bonding wires (132, 134) and heat transfer wires (136) are encapsulated by the resin 150.

According to the first embodiment of the present invention, the heat generated by the chips (121, 122) and trapped in the adhesive layer (140) can be transferred to outer terminals, such as solder balls (160a). Therefore, the excessive accumulation of heat can be prevented.

Because the heat transfer wires (136) can be manufactured using conventional wire bonding method, there is no need for an additional process or apparatus for manufacturing the heat transfer mechanism. In addition, the thermal characteristics of the stacked chip package (200) can be calibrated by controlling the number or the size of the heat transfer wires (136).

Figure 6:
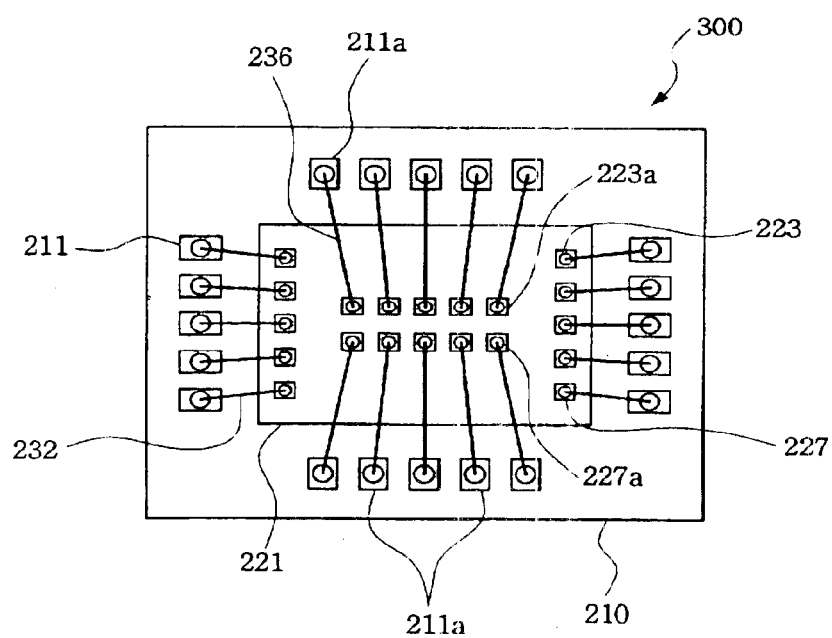
FIG. 6 is a plan view of the stacked chip package according to a second embodiment of the present invention.

Referring to FIG. 6, according to a second embodiment of the present invention, dummy bonding pads (223a) are provided on substantially the center portion of the lower chip (221). Preferably, the positions of the dummy bonding pads (223a) are separated from the bonding pads (223). As shown in FIG. 6, the bonding pads (223) are provided along the edges of the chip (221) separated from the dummy bonding pads (223a). The dummy bonding pads (223a) are used for heat dissipation, not for electrical connection purposes. However, it is possible for the dummy bonding pads (223a) to be used for connection means to ground.

Preferably, one end of each heat transfer wire (236) is connected to a dummy bonding pad (223a) by stitch bonding, and the other end is connected to a dummy board pad (211a) formed on a board 210 similar to the board 110 of FIG. 3 by ball bonding.

Figure 7:
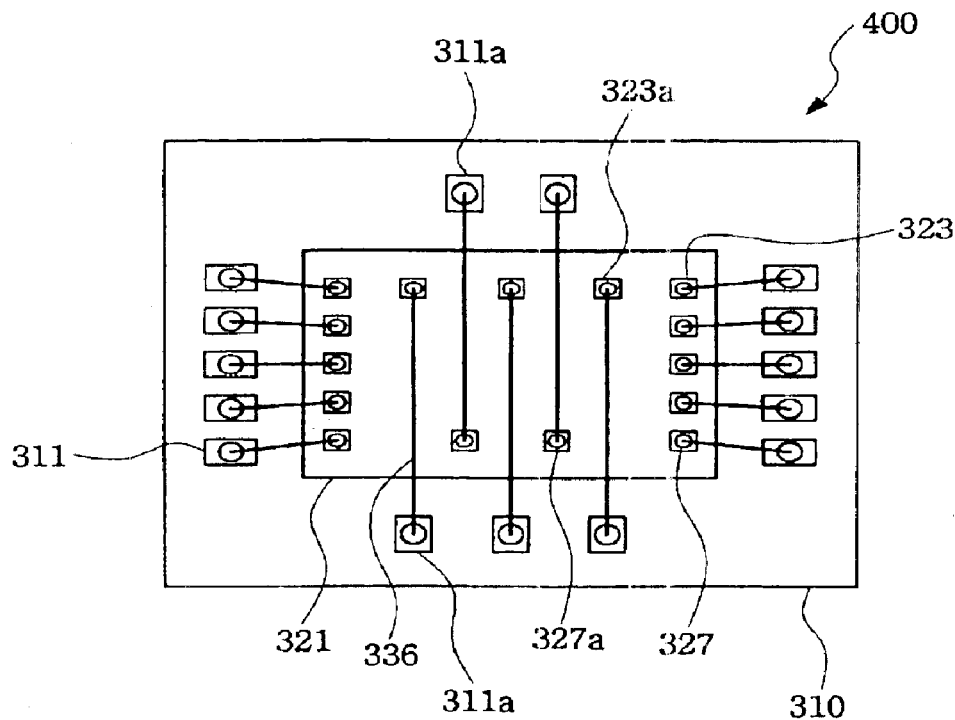
FIG. 7 is a plan view of the stacked chip package according to a third embodiment of the present invention.

Referring to FIG. 7, according to a third embodiment of the present invention, dummy bonding pads (323a) are provided on opposite edges of the lower chip (321). Preferably, the dummy bonding pads (323a) are separated from the bonding pads (323). As with the first and second embodiments, the dummy bonding pads (323a) are used for heat dissipation or for connection to ground.

Figure 8:
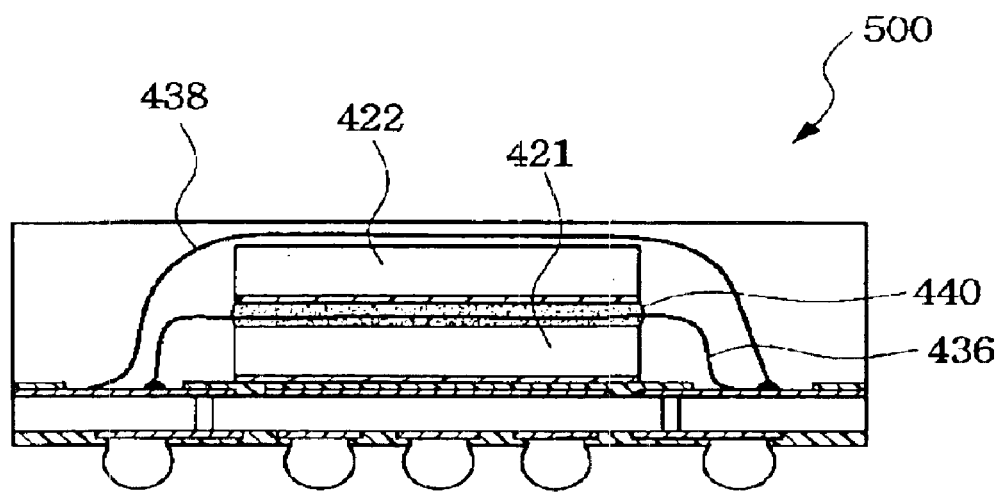
FIG. 8 is a cross-sectional view of the stacked chip package according to a fourth embodiment of the present invention.

As shown in FIG. 7, one end of each heat transfer wire (336) is connected to a dummy bonding pad (323a), preferably by stitch bonding, and the other end is connected to a dummy board pad (311a), preferably by ball bonding. For stable stitch bonding, dummy electrode bumps (327a) may be formed on the dummy bonding pad (323a) before the stitch bonding is performed to connect the heat transfer wire (336) with the dummy bonding pad (323a). The dummy bonding pads (232a) are positioned apart from the correspondingly connected dummy board pads (311a), in order to increase the area of the lower chip (321) covered with the heat transfer wires (336). The dummy bonding pad (323a) may be formed in a zigzag fashion. Also, the dummy bonding pad (323a) is formed on the lower chip (321) adjacent one edge of the lower chip (321), while the dummy board pad (311a) is formed on a board (310) adjacent to the edge of the lower chip (321) opposite the one edge. Referring to FIG. 8, according to the fourth embodiment of the present invention, upper heat transfer wires (438) are provided on the upper chip (422) in order to enhance the heat dissipation of the upper chip (422). Therefore, the heat generated by the stacked chip package (500) can be more easily dissipated by both the lower heat transfer wires (436) and the upper heat transfer wires (438).

According to the present invention, the heat transfer wires disposed between stacked chips can transfer the heat out of the stacked chip package, and the heat transfer wires may not increase the thickness of the stacked chip package. In addition, the heat transfer wires can be easily manufactured by the wire bonding method, so that there is no need for a special process or apparatus for manufacturing the heat dissipation means. Therefore, a cost-saving heat dissipation means is provided in the present invention.

Although the stacked chip package made by stacking only two chips is described in the embodiments of the present invention, it should be apparent to a person skilled in the art that the present invention can be applied to the stacked chip package made by stacking more than two chips.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A stacked chip package comprising:
    a board including a plurality of board pads and a plurality of dummy board pads;
    a plurality of chips each having at least one bonding pad, said plurality of chips being stacked one atop the other on the board; and
    at least one heat transfer wire disposed between the chips, wherein at least one end of each heat transfer wire is connected to at least one dummy board pad, and at least one bonding pad is electrically connected to at least one of the board pads.

2. A stacked chip package according to claim 1, wherein both ends of each heat transfer wire are connected to the plurality of dummy board pads.

3. A stacked chip package according to claim 1, further comprising at least one dummy bonding pad on the chips, wherein at least one end of at least one heat transfer wire is connected to at least one of the dummy bonding pads on the chips.

4. A stacked chip package according to claim 3, wherein each dummy bonding pad is separated from each bonding pad.

5. The stacked chip package according to claim 3, wherein the at least one dummy bonding pad is provided on substantially the center portion of the lower chip.

6. The stacked chip package according to claim 3, wherein one end of each heat transfer wire is connected to the dummy bonding pad by stitch bonding, and the other end is connected to the dummy board pad by ball bonding.

7. A stacked chip package according to claim 1, wherein a plurality of solder balls are joined to the board, said solder balls being electrically connected to the board pads.

8. A stacked chip package according to claim 1, wherein at least one of the heat transfer wires is connected to ground.

9. A stacked chip package according to claim 1, wherein the chips are adhered to each other by an adhesive layer.

10. A stacked chip package according to claim 9, wherein at least one heat transfer wire is disposed within the adhesive layer.

11. A stacked chip package according to claim 1, wherein at least one heat transfer wire is disposed on the top of the stacked chips.

12. A stacked chip package according to claim 1, wherein each heat transfer wire is a conventional bonding wire.

13. A method for producing a stacked chip package comprising:
    providing a board including at least one board pad and least one dummy board pad;
    providing a plurality of chips each having at least one bonding pad;
    stacking said plurality of chips being one atop the other on the board; and
    disposing at least one heat transfer wire between the chips, at least one end of each heat transfer wire being connected to at least one dummy board pad for heat dissipation purposes, and each bonding pad being electrically connected to at least one of the board pads.

14. A method according to claim 13, wherein both ends of each heat transfer wire are connected to a dummy board pad.

15. A method according to claim 13, wherein at least one dummy bonding pad is provided on the chips, and at least one end of at least one heat transfer wire is connected to at least one of the dummy bonding pads on the chips.

16. A method according to claim 15, wherein each dummy bonding pad is separated from each bonding pad.

17. A method according to claim 13, wherein a plurality of solder balls are joined to the board, said solder balls being electrically connected to the board pads.

18. A method according to claim 13, wherein at least one of the heat transfer wires is connected to ground.

19. A method according to claim 13, wherein the chips are adhered to each other by an adhesive layer.

20. A method according to claim 19, wherein at least one heat transfer wire is disposed within the adhesive layer.

* * * * *